(12) United States Patent
Liaw

(10) Patent No.: US 11,784,180 B2
(45) Date of Patent: *Oct. 10, 2023

(54) SEMICONDUCTOR DEVICE LAYOUT

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 158 days.

This patent is subject to a terminal disclaimer.

(21) Appl. No.: 17/373,302

(22) Filed: Jul. 12, 2021

(65) Prior Publication Data

US 2021/0343700 A1    Nov. 4, 2021

Related U.S. Application Data

(60) Continuation of application No. 16/721,197, filed on Dec. 19, 2019, now Pat. No. 11,063,032, which is a
(Continued)

(51) Int. Cl.
*H01L 27/02* (2006.01)
*H01L 27/092* (2006.01)
(Continued)

(52) U.S. Cl.
CPC .... *H01L 27/0207* (2013.01); *H01L 21/76224* (2013.01); *H01L 21/823807* (2013.01); *H01L 21/823821* (2013.01); *H01L 21/823828* (2013.01); *H01L 27/0922* (2013.01); *H01L 27/0924* (2013.01); *H01L 27/0928* (2013.01); *H01L 29/0646* (2013.01); *H01L 29/0649* (2013.01); *H01L 29/41791* (2013.01); *H01L 29/66545* (2013.01); *H01L 21/31053* (2013.01); *H01L 21/823878* (2013.01); *H01L 29/0847* (2013.01); *H01L 29/165* (2013.01);
(Continued)

(58) Field of Classification Search
CPC ............. H01L 27/0207; H01L 27/0924; H01L 21/823821

See application file for complete search history.

(56) References Cited

U.S. PATENT DOCUMENTS 8,315,084 B2    11/2012    Liaw et al.
9,099,172 B2    8/2015    Liaw
(Continued)

*Primary Examiner* — Mark V Prenty
(74) *Attorney, Agent, or Firm* — HAYNES AND BOONE, LLP

(57) ABSTRACT

Semiconductor devices and semiconductor cell arrays are provided herein. In some examples, a semiconductor device includes a multi-fin active region, a mono-fin active region, and an isolation feature between the multi-fin active region and the mono-fin active region. The multi-fin active region includes a first plurality of fins, a second plurality of fins parallel to the first plurality of fins, a first n-type field effect transistor (FET), and a first p-type FET. The mono-fin active region abuts the multi-fin active region. The mono-fin active region includes a first fin, a second fin different from the first fin, a second n-type FET, and a second p-type FET. The isolation feature is parallel to the first and second gate structures.

20 Claims, 6 Drawing Sheets

Related U.S. Application Data division of application No. 15/718,696, filed on Sep. 28, 2017, now Pat. No. 10,522,528.

(51) Int. Cl.
| | |
|---|---|
| *H01L 29/06* | (2006.01) |
| *H01L 29/417* | (2006.01) |
| *H01L 21/8238* | (2006.01) |
| *H01L 29/66* | (2006.01) |
| *H01L 21/762* | (2006.01) |
| *H01L 29/45* | (2006.01) |
| *H01L 29/51* | (2006.01) |
| *H01L 29/49* | (2006.01) |
| *H01L 29/167* | (2006.01) |
| *H01L 29/165* | (2006.01) |
| *H01L 29/78* | (2006.01) |
| *H01L 29/08* | (2006.01) |
| *H01L 21/3105* | (2006.01) |

(52) U.S. Cl.
CPC ............ *H01L 29/167* (2013.01); *H01L 29/45* (2013.01); *H01L 29/495* (2013.01); *H01L 29/4966* (2013.01); *H01L 29/517* (2013.01); *H01L 29/7848* (2013.01)

(56) References Cited

U.S. PATENT DOCUMENTS

| | | |
|---|---|---|
| 9,257,439 B2 | 2/2016 | Liaw |
| 9,613,953 B2 | 4/2017 | Liaw |
| 10,056,390 B1 | 8/2018 | Liaw |
| 10,522,528 B2 | 12/2019 | Liaw |
| 11,063,032 B2 * | 7/2021 | Liaw ............... H01L 21/823828 |

\* cited by examiner

SEMICONDUCTOR DEVICE LAYOUT

PRIORITY DATA

This is a continuation application of U.S. patent application Ser. No. 16/721,197, filed Dec. 19, 2019, which is divisional application of U.S. patent application Ser. No. 15/718,696, filed Sep. 28, 2017, now issued as U.S. Pat. No. 10,522,528, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. This scaling down process generally provides benefits by increasing production efficiency and lowering associated costs, but it has also increased the complexity of processing and manufacturing ICs.

For example, fin-like field effect transistors (FinFETs) have become a popular choice for design of high performance circuitry. While FinFETs' narrow fin width helps achieve short channel control, their source/drain (S/D) features tend to have a small landing for low-contact-resistance S/D contacts. FinFETs with multiple fins, or multi-fin FETs, are proposed for high-speed applications. However, multi-fin FETs suffer higher leakage and therefore higher power consumption when compared with FinFETs with a single fin.

Accordingly, improvements in semiconductor devices to achieve both high switching speed and low power consumption are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
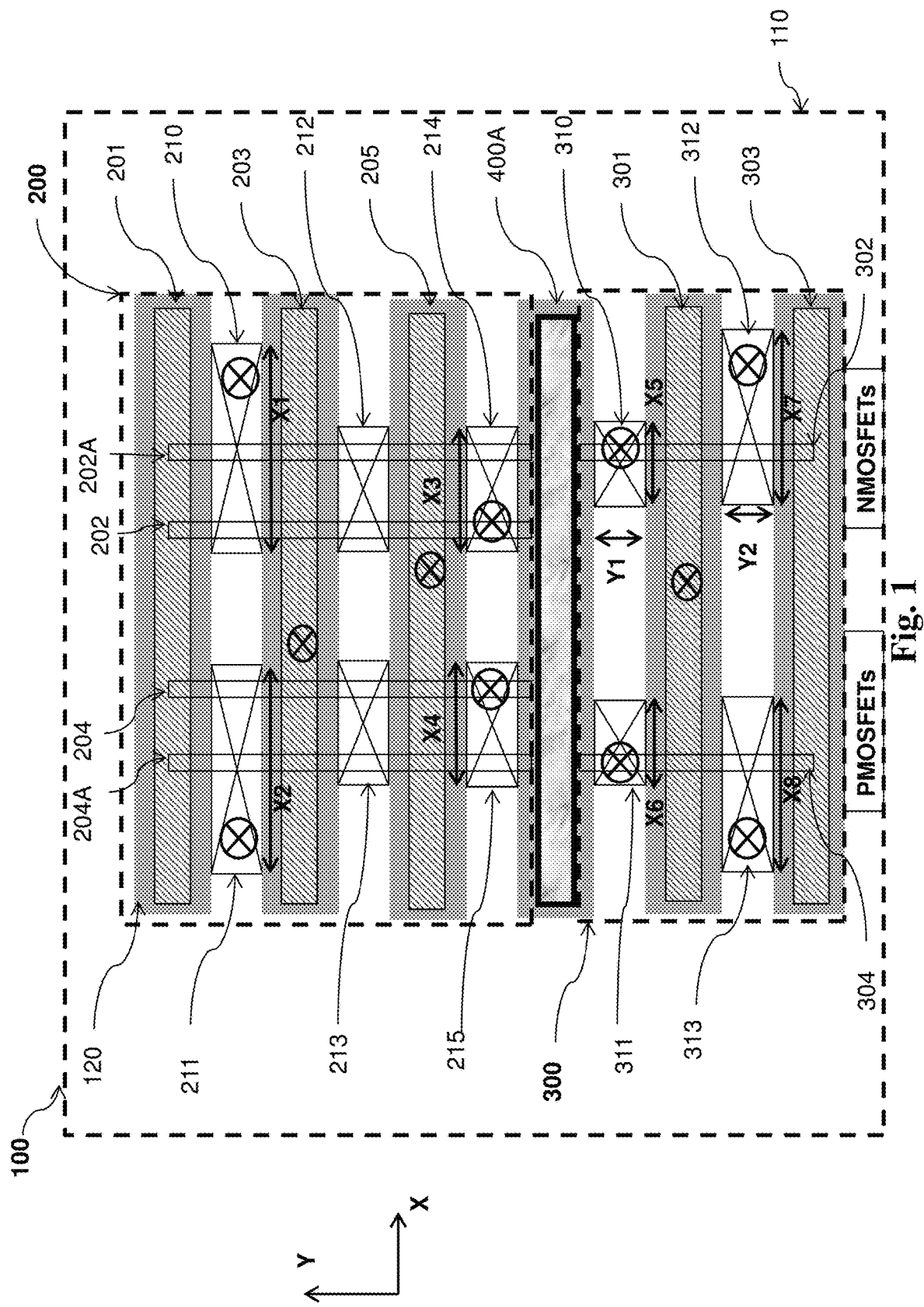
FIG. 1 is a diagrammatic top view of a semiconductor device, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly, related to standard cells that include multi-fin devices or mono-fin devices.

Referring to FIG. 1, illustrated therein is a top view of a semiconductor device 100 according to aspects of the present disclosure. The semiconductor device 100 includes silicon-containing fins 202, 202A, 204, 204A, 302, and 304. Fins 202, 202A, 204, and 204A are formed in a multi-fin active region 200 while fins 302 and 304 are formed within a mono-fin active region 300. In some instances, fins 202 and 202A are formed over a p-type well on semiconductor substrate 110 and fins 204 and 204A are formed over an n-type well on semiconductor substrate 110. In some embodiments, upon completion of the multi-fin active region 200, fins 202 and 202A are part of at least one n-type FET (nFET) and fins 204 and 204A are part of at least one p-type FET (pFET). While FIG. 1 shows that each of the nFET and pFET in multi-fin active region 200 includes two fins, implementation with more than two fins per FET can be appreciated by people skilled in the art upon examination of the present disclosure. In cases where each FETs of multi-fin active region 200 include two fins, the multi-fin active region can be referred to as a double-fin active region. In some embodiments, each of multi-fin active region 200 and mono-fin active region 300 constitutes a standard cell. In that regard, multi-fin active region 200 can be referred to as a multi-fin standard cell and mono-fin active region 300 can be referred to as a mono-fin standard cell.

In some embodiments, fin 302 is formed over the same p-type well where fins 202 and 202A are formed and fin 304 is formed over the same n-type well where fins 204 and 204A are formed. Upon completion of the mono-fin active region 300, fin 302 is part of an nFET and fin 304 is part of a pFET. As their names suggest, each the nFET and pFET in multi-fin active region 200 includes more than one fin while each of the nFET and pFET in mono-fin active region 300 includes a single fin. The semiconductor substrate 110 usually includes silicon. Alternatively, the semiconductor substrate 110 may include thereover epitaxial layers of germanium, silicon germanium, or other semiconductor materials and combinations. In some instances, depending on the design the semiconductor device 100, the semiconductor substrate 110 may be doped with p-type dopants such as boron (B), aluminum (Al) and gallium (Ga) or n-type dopants such as antimony (Sb), arsenic (As) and phosphorous (P).

In some embodiments, a fin such as fins 202, 202A, 204, 204A, 302 and 304 is formed of epitaxial layers on the semiconductor substrate 110 and the epitaxial layers are formed of silicon (Si) alone or together with a semiconductor material that is compatible with silicon. Such a semiconductor material includes germanium (Ge) and carbon (C). In some implementations, the epitaxial layers can include layers of different compositions. In some instances, the epitaxial layers include alternating layers of two different compositions. Introduction of Ge or C into Si lattice is known to strain the Si lattice and is usually utilized to improve the device performance in certain aspects. In some embodiments, the epitaxial layers are formed of epitaxial growth of Si, C and Ge and combinations thereof using techniques such as epitaxial deposition by chemical vapor deposition (CVD) or low-pressure chemical vapor deposition (LPCVD). By controlling the delivery of gas reactants and other process parameters during the CVD epitaxial deposition, the concentrations of Si, C and/or Ge along the height of the epitaxial layers can be modulated. In embodiments where the fins 202, 202A, 204, 204A, 302 and 304 are formed of epitaxial layers, the epitaxial layers are first formed over the semiconductor substrate 110 and then the epitaxial layers are patterned as described below. In some embodiments, regions for n-type FETs and P-type FETs are independently tuned for enhanced electron-mobility and hole-mobility, respectively. For examples, silicon carbide and silicon germanium are epitaxially grown in the regions for N-type FETs and the regions for P-type FETs, respectively. In some other examples, carbide and germanium are doped into the regions for N-type FETs and the regions for P-type FETs, respectively by ion-implantation. Further, in some implementations, the epitaxial layers on the semiconductor substrate 110 can also be doped to p-type dopants such as B, Al, Ga or n-type dopants such as Sb, As, and P. In those implementations, the resulting fins 202, 202A, 204, 204A, 302 and 304, as the case may be, would be doped accordingly.

In some embodiments, the fins 202, 202A, 204, 204A, 302, and 304 are formed from the epitaxial layers by photolithography patterning and etching. For example, a patterned photoresist layer is formed on the epitaxial layers by a photolithography technique, and then an etching process, such as anisotropic etching, is applied to the epitaxial layers to form one or more fins. In another example, a hard mask is used. In that case, the hard mask is formed by depositing a hard mask material on the epitaxial layer. A photoresist layer is then deposited on the hard mask. After patterned using photolithography, the photoresist on the hard mask then serves as the etch mask when the hard mask is etched and patterned. Thereafter, an etching process, such as anisotropic etching, is applied to the epitaxial layers to form one or more fins using the hard mask as an etch mask. To isolate a fin from an adjacent fin, a dielectric material (such as thermally grown silicon oxide and CVD deposited silicon oxide) is formed to fill trenches between a fin and its neighboring fins. The dielectric layer is then polished by chemical mechanical polishing (CMP) and then etched back to expose a portion of the fin while a portion of the fin remains covered by the etched back dielectric layer, usually referred to as shallow trench isolation (STI). For example, fins 202 and 202A, fins 202 and 204, and fins 204 and 204A are each isolated from one another by STI features. In some embodiments, fin 204A and 304 are first formed as a unitary fin before further processes separate them. In some other embodiment, fin 204 is first formed as part of a fin that extends into mono-fin active region 300 before later processes remove the extension of fin 204 in mono-fin active region 300. The same applies to fins 202 and 202A. Fins 202A and 302 are first formed as a continuous fin before they are separated at a later process step. Fin 202 is formed across both multi-fin active region 200 and mono-fin active region 300 before its extension into mono-fin active region 200 is removed at a later operation.

As shown in FIG. 1, in some embodiments, multi-fin active region 200 includes gate structure 201, 203 and 205 and mono-fin active region 300 includes gate structures 301 and 303. Gate structures 201, 203 and 205 are formed over and span across fins 202A, 202, 204, and 204A. Gate structures 301 and 303 are formed over and span across fins 302 and 304. To form these gate structures, dummy gates are first formed at their current locations and then these dummy gates are replaced by high-K metal gate stack. The formation of a dummy gate includes depositing a dummy gate layer containing polysilicon (poly-Si) or other suitable material and patterning the dummy gate layer. A gate hard mask layer may be formed on the dummy gate material layer and is used as an etch mask during the formation of the dummy gate. The gate hard mask layer may include any suitable material, such as a silicon oxide ($SiO_2$), a silicon nitride (SiN), a silicon carbide (SiC), a silicon oxynitride (SiON), other suitable materials, and/or combinations thereof. In some embodiments, the patterning process to form a dummy gate includes forming a patterned resist layer by lithography process; etching the hard mask layer using the patterned resist layer as an etch mask; and etching the gate material layer to form the dummy gate using the patterned hard mask layer as an etch mask.

To form functional gate structure 201, 203, 205, 301, and 303, dummy gates are replaced with high-K metal gate stacks. In some embodiments, the high-K metal gate stack at least includes a gate dielectric layer interfacing the fins and a metal layer (not shown) over the gate dielectric layer. The gate dielectric layer can be formed of high-K dielectrics such as hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2Oi_2$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$), lead lanthanum titanate, strontium bismuth tantalate, bismuth titanate and barium zirconium titanate. In some instances, the high-K metal gate stack may include one or more work function metal layers formed of, for example, TiN, TaN, TaCN, TiCN, TiC, Mo, and W.

In some instances, one or more gate sidewall features (or gate spacers) 120 are formed on the sidewalls of gate structure 201, and similarly on the sidewalls of the other gate structures 203, 205, 301 and 303. The gate spacers 120 may be used to offset the subsequently formed S/D features and may be used for designing or modifying the S/D feature profile. The gate spacers 120 may include any suitable dielectric material, such as a semiconductor oxide, a semiconductor nitride, a semiconductor carbide, a semiconductor oxynitride, other suitable dielectric materials, and/or combinations thereof. The gate spacers 120 may have multiple layers, such as two layers (a silicon oxide ($SiO_2$) film and a silicon nitride (SiN) film) or three layers (a silicon oxide ($SiO_2$) film; a silicon nitride (SiN) film; and a silicon oxide ($SiO_2$) film). The formation of the gate spacers 120 includes deposition and anisotropic etching, such as dry etching.

Source/drain (S/D) features are formed over the fins on either side of a non-floating gate structure, such as gate structure 203, 205 and 301. As shown in FIG. 1, for the nFET controlled by gate structure 203 in multi-fin active region 200, a S/D feature is formed below S/D contact 210 and a S/D feature is formed below S/D contact 212, with S/D contacts 210 and 212 on different sides of gate structure 203. In some implementations, with respect to any FET in multi-fin active region 200, a S/D feature and its corresponding S/D contact are formed across and span over all fins of that FET. For example, S/D contact 210 and the S/D feature therebelow and S/D contact 212 and the S/D feature therebelow are formed over and span across fins 202 and 202A. Similarly, for the nFET controlled by gate structure 205 in multi-fin active region 200, S/D contact 212 and the S/D feature therebelow are on one side of gate structure 205 while S/D contact 214 and the S/D feature therebelow are on the other side of gate structure 205. The same applies to the pFETs in multi-fin active region 200 and the nFET and pFET in mono-fin active region 300. For the pFET controlled by gate structure 203, S/D contact 211 and the S/D feature therebelow are on one side of gate structure 203 while S/D contact 213 and S/D feature therebelow are on the other side of gate structure 203. For the pFET controlled by gate structure 205, S/D contact 213 and the S/D feature therebelow are on one side of gate structure 205 while S/D contact 215 and S/D feature therebelow are on the other side of gate structure 205. For the nFET controlled by gate structure 301, S/D contact 310 and the S/D feature therebelow are on one side of gate structure 301 while S/D contact 312 and S/D feature therebelow are on the other side of gate structure 301. Finally, for the pFET controlled by gate structure 301, S/D contact 311 and the S/D feature therebelow are on one side of gate structure 301 while S/D contact 313 and S/D feature therebelow are on the other side of gate structure 301.

At least for purpose of this disclosure, an FET that includes multiple fins is still considered one FET as long as its S/D features and gate structure are disposed over the same fins. For example, the device having gate structure 203, S/D features below S/D contacts 211 and 213 is considered a single pFET even when the device spans across fin 204 and fin 204A. The same applies to FETs that have gate structures and S/D features spanning across more than two fins.

The S/D features may be in-situ doped during the epitaxy process by introducing doping species including: p-type dopants, such as boron or BF2; n-type dopants, such as phosphorus or arsenic; and/or other suitable dopants including combinations thereof. If the S/D features are not in-situ doped, an implantation process (i.e., a junction implant process) is performed to introduce the corresponding dopant into the S/D features. In an exemplary embodiment, S/D features of a pFET include SiGeB, while S/D features an nFET include SiP. One or more annealing processes may be performed thereafter to activate the S/D features. Suitable annealing processes include rapid thermal annealing (RTA), laser annealing processes, other suitable annealing technique or a combination thereof.

In some instances, a dielectric material layer, sometimes referred to as interlayer dielectric (ILD), is to be deposited over the substrate, filling the space between the S/D features and the space between gate structures. The ILD layer is to undergo a chemical mechanical polishing process for planarization.

S/D contacts are formed over S/D features. An anisotropic etching process is used to form an opening through the ILD layer and S/D features. Then, the opening is filled with conductive material. In some instances, before conductive material is filled in the opening, silicide may be formed in the opening to reduce contact resistance. Silicide can be formed by reacting silicon with a metal, such as titanium, tantalum, nickel or cobalt. In some examples, the silicide may be formed by a process referred to as self-aligned silicide or salicide. The salicide process includes depositing one of the aforementioned metals, annealing to cause the reaction between the metal and silicon, and removing unreacted metal materials. To prevent diffusion of impurity into the conductive material, a barrier layer may be formed on the sidewall of the opening. The barrier layer may be formed of a single layer of titanium nitride (TiN) or tantalum nitride (TaN) or a multilayer such as Ti/TiN, Ta/TaN layers. In some instances, the conductive material is filled in the opening after both silicide and barrier layers are formed. Suitable conductive materials include tungsten (W), copper (Cu), aluminum (Al), and cobalt (Co).

In some embodiments, multi-fin active region 200 abuts mono-fin active region 300 along the Y direction, or the direction of the fins 202, 202A, 204, 204A, 302, and 304, as shown in FIG. 1. In some implementations, although multi-fin active region 200 abuts mono-fin active region 300, they are isolated by an isolation feature 400A. Particularly, in FIG. 1, no fin in multi-fin active region 200 extends continuously into mono-fin active region 300. Isolation feature 400A includes a dummy dielectric gate. As described above, to form a regular gate structure, a dummy gate, usually formed of poly-Si, is formed at the location where the gate structure is to be formed and the dummy gate is later removed and replaced with a high-K metal gate stack. Here, in terms of fabrication of isolation feature 400A, a dummy gate is first formed at the location where the isolation feature 400A is formed. However, after the dummy gate is removed, instead of replacing the dummy gate with a high-K metal gate stack, a dielectric material is used to replace the dummy gate. In some instances, isolation feature 400A is formed of silicon oxide ($SiO_2$), a silicon nitride (SiN), a silicon carbide (SiC), a silicon oxynitride (SiON), other suitable materials, and/or combinations thereof.

In some embodiments, each of the S/D contacts is substantially rectangular in shape. Along the X direction, S/D contacts 210, 211, 212, 213, 214, 215, 310, 311, 312, and 313 have lengths X1, X2, X3, X4, X5, X6, X7, and X8, respectively. In some embodiments, X1 is substantially equal to X2, X3 is substantially equal to X4, X5 is substantially equal to X6, and X7 is substantially equal to X8. In addition, along the Y direction, S/D contact 310 has a width Y1 and S/D contact 312 has a width Y2. In some implementations, S/D contacts 210 and 312 are electrically connected to a Vss line, also referred to as a source node. In those implementations, X1 is more than 1.5 times of X3. Similarly, X7 is more than 1.5 times of X3. In some other embodiments, to reduce contact capacitance between S/D contact 214 and S/D contact 310, S/D contact 310 is intentionally shortened. In some implementations where the multi-fin active region 200 includes more than two fins for both its nFET(s) and pFET(s), X3 is 1.1 to 3.0 times of X5. Put differently, in these implementations, the ratio of X3 over X5 ranges between 1.1 and 3.0. In some other implementations, X3 is 2 to 4 times of X5 if the multi-fin active region 200 includes more than two fins. In cases where multi-fin active region 200 includes two fins for both its nFET(s) and pFET(s), X3 is about 1.1 to 2.0 times of X5. Put differently, the ratio of X3 over X5 in these cases ranges between 1.1 and 2.0. In some other implementations, X3 is 1.3 to 2.0 times of X5 if the multi-fin active region 200 includes two fins. In some instances, Y1 and Y2 are substantially the same. However, in instances where the isolation feature reduces loading effect in the area near S/D contact 310, Y1 is about 1.1 times of Y2. That is, Y1 is 10% larger than Y2.

Figure 2:
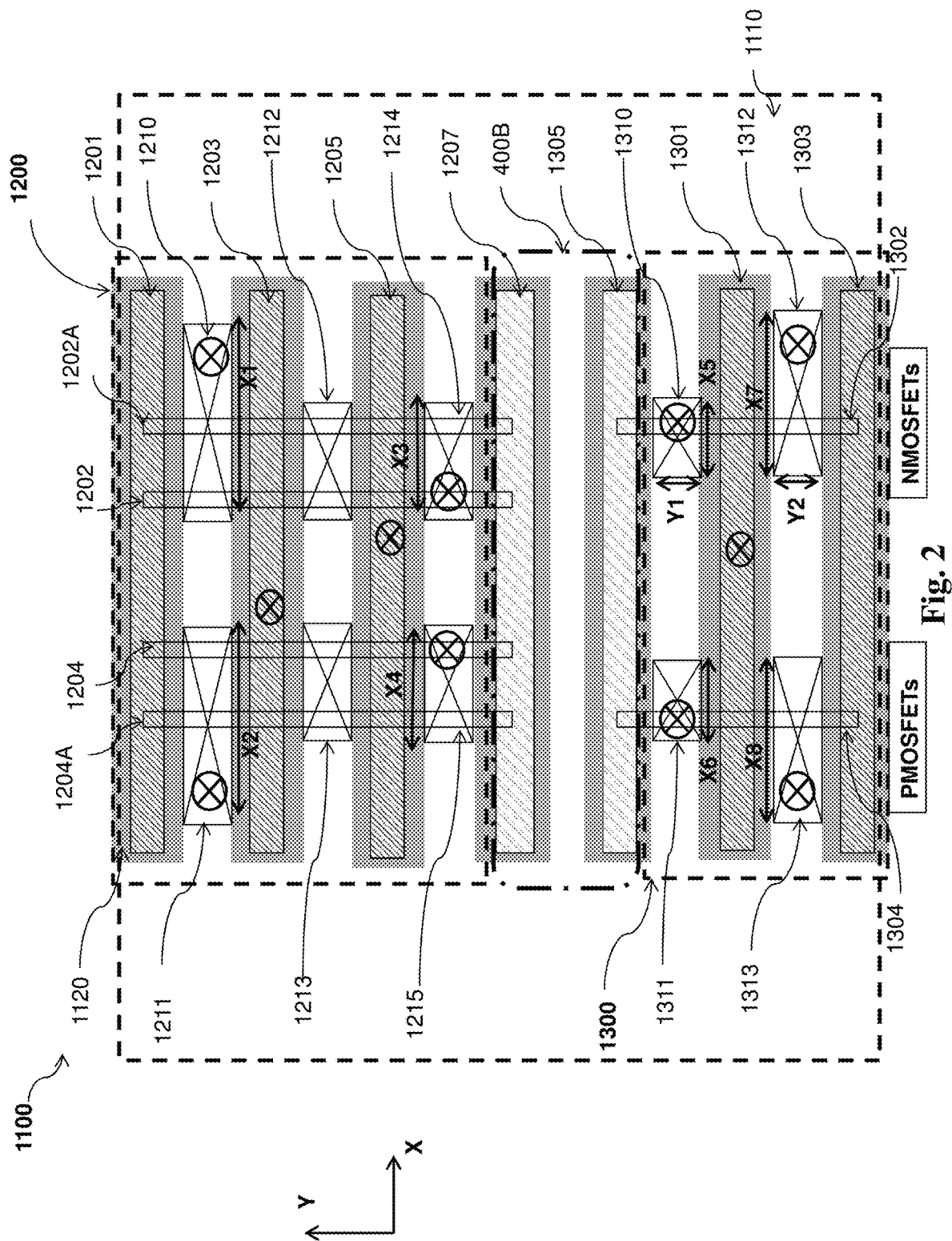
FIG. 2 is a diagrammatic top view of a semiconductor device layout, according to aspects of the present disclosure.

Referring now to FIG. 2, illustrated therein is a top view of semiconductor device 1100 according to aspects of the present disclosure. Semiconductor device 1100 includes fins 1202, 1202A, 1204, 1204A, 1302, and 1304. Fins 1202, 1202A, 1204, and 1204A are formed in a multi-fin active region 1200 while fins 1302 and 1304 are formed within a mono-fin active region 1300. In some instances, fins 1202 and 1202A are formed over a p-type well on semiconductor substrate 1110 and fins 1204 and 1204A are formed over an n-type well on semiconductor substrate 1110. In some embodiments, upon completion of the multi-fin active region 1200, fins 1202 and 1202A are part of at least one n-type FET (nFET) and fins 1204 and 1204A are part of at least one p-type FET (pFET). While FIG. 2 shows that each of the nFET and pFET in multi-fin active region 1200 includes two fins, implementation with more than two fins per FET can be appreciated by people skilled in the art upon examination of the present disclosure. In cases where each FETs of multi-fin active region 1200 include two fins, the multi-fin active region can be referred to as a double-fin active region. In some embodiments, each of multi-fin active region 1200 and mono-fin active region 1300 constitutes a standard cell. In that regard, multi-fin active region 1200 can be referred to as a multi-fin standard cell and mono-fin active region 1300 can be referred to as a mono-fin standard cell.

In some embodiments, fin 1302 is formed over the same p-type well where fins 1202 and 1202A are formed and fin 1304 is formed over the same n-type well where fins 1204 and 1204A are formed. Upon completion of the mono-fin active region 1300, fin 1302 is part of an nFET and fin 1304 is part of a pFET. As their names suggest, each the nFET and pFET in multi-fin active region 1200 includes more than one fin while each of the nFET and pFET in mono-fin active region 1300 includes a single fin. Semiconductor substrate 1110 and fins 1202A, 1202, 1204, 1204A, 1302 and 1304 contain materials and are formed in manners similar to those described above with respect to FIG. 1.

As shown in FIG. 2, in some embodiments, multi-fin active region 1200 includes gate structure 1201, 1203, 1205, and 1207 and mono-fin active region 1300 includes gate structures 1305, 1301 and 1303. Gate structures 1201, 1203, 1205, and 1207 are formed over and span across fins 1202A, 1202, 1204, and 1204A. Gate structures 1305, 1301 and 1303 are formed over and span across fins 1302 and 1304. In some embodiments, gate structures 1201, 1203, 1205, 1301, and 1303 contain materials and are formed in manners similar to those described above with respect to FIG. 1. Particularly, the formation of gate structures 1201, 1203, 1205, 1301, and 1303 include formation of dummy gates and removal and replacement of those dummy gates. In some instances, gate structures 1207 and 1305 are dummy gates and are not replaced by high-K metal gate stacks. For the same reason, gate structures 1207 and 1305 may sometimes be referred to as dummy gate 1207 and dummy gate 1305, respectively. As will be described below, gate structures 1207 and 1305 can be considered as part of isolation feature 400B.

Source/drain (S/D) features are formed over the fins on either side of a non-floating gate structure, such as gate structure 1203, 1205 and 1301. As shown in FIG. 2, for the nFET controlled by gate structure 1203 in multi-fin active region 1200, a S/D feature is formed below S/D contact 1210 and a S/D feature is formed below S/D contact 1212, with S/D contacts 1210 and 1212 on different sides of gate structure 1203. In some implementations, with respect to any FET in multi-fin active region 1200, a S/D feature and its corresponding S/D contact are formed across and span over all fins of that FET. For example, S/D contact 1210 and the S/D feature therebelow and S/D contact 1212 and the S/D feature therebelow are formed over and span across fins 1202 and 1202A. Similarly, for the nFET controlled by gate structure 1205 in multi-fin active region 1200, S/D contact 1212 and the S/D feature therebelow are on one side of gate structure 1205 while S/D contact 1214 and the S/D feature therebelow are on the other side of gate structure 1205. The same applies to the pFETs in multi-fin active region 1200 and the nFET and pFET in mono-fin active region 1300. For the pFET controlled by gate structure 1203, S/D contact 1211 and the S/D feature therebelow are on one side of gate structure 1203 while S/D contact 1213 and S/D feature therebelow are on the other side of gate structure 1203. For the pFET controlled by gate structure 1205, S/D contact 1213 and the S/D feature therebelow are on one side of gate structure 1205 while S/D contact 1215 and S/D feature therebelow are on the other side of gate structure 1205. For the nFET controlled by gate structure 1301, S/D contact 1310 and the S/D feature therebelow are on one side of gate structure 1301 while S/D contact 1312 and S/D feature therebelow are on the other side of gate structure 1301. Finally, for the pFET controlled by gate structure 1301, S/D contact 1311 and the S/D feature therebelow are on one side of gate structure 1301 while S/D contact 1313 and S/D feature therebelow are on the other side of gate structure 1301. S/D features and S/D contacts in FIG. 2 contain materials and are formed in manners similar to those described above with respect to FIG. 1.

At least for purpose of this disclosure, an FET that includes multiple fins is still considered one FET as long as its S/D features and gate structure are disposed over the same fins. For example, the device having gate structure 1203, S/D features below S/D contacts 1211 and 1213 is considered a single pFET even when the device spans across fin 1204 and fin 1204A. The same applies to FETs that have gate structures and S/D features spanning across more than two fins.

In some embodiments, multi-fin active region 1200 abuts mono-fin active region 1300 along the Y direction, or the direction of the fins 1202, 1202A, 1204, 1204A, 1302, and 1304, as shown in FIG. 2. In the implementations represented by FIG. 2, although multi-fin active region 1200 abuts mono-fin active region 1300, they are isolated by an isolation feature 400B. Particularly, no fin in multi-fin active region 1200 extends continuously into mono-fin active region 1300. Isolation feature 400B includes a fin cutout region between dummy gate 1207 and dummy gate 1305. In a broader sense, dummy gates 1207 and 1305 are considered part of isolation feature 400B. As described above, gate structures 1207 and 1305 are dummy gates and are not replaced with any high-K metal gate stacks. In the embodiments shown in FIG. 2, gate spacers 1120 are formed on the sidewalls of gate structures 1201, 1203, 1205, 1207, 1301, 1303, and 1305. Gate spacers 1120 contain materials and are formed in manners similar to those described above with respect to FIG. 1.

In some embodiments, each of the S/D contacts is substantially rectangular in shape. Along the X direction, S/D contacts 1210, 1211, 1212, 1213, 1214, 1215, 1310, 1311, 1312, and 1313 have lengths X1, X2, X3, X4, X5, X6, X7, and X8, respectively. In some embodiments, X1 is substantially equal to X2, X3 is substantially equal to X4, X5 is substantially equal to X6, and X7 is substantially equal to X8. In addition, along the Y direction, S/D contact 1310 has a width Y1 and S/D contact 1312 has a width Y2. In some implementations, S/D contacts 1210 and 1312 are electrically connected to a Vss line, also referred to as a source node. In those implementations, X1 is more than 1.5 times of X3. Similarly, X7 is more than 1.5 times of X3. In some other embodiments, to reduce contact capacitance between S/D contact 1214 and S/D contact 1310, S/D contact 1310 is intentionally shortened. In some implementations where the multi-fin active region 1200 includes more than two fins for both its nFET(s) and pFET(s), X3 is 1.1 to 3.0 times of X5. Put differently, in these implementations, the ratio of X3 over X5 ranges between 1.1 and 3.0. In some other implementations, X3 is 2 to 4 times of X5 if the multi-fin active region 200 includes more than two fins. In cases where multi-fin active region 1200 includes two fins for both its nFET(s) and pFET(s), X3 is about 1.1 to 2.0 times of X5. Put differently, the ratio of X3 over X5 in these cases ranges between 1.1 and 2.0. In some other implementations, X3 is 1.3 to 2.0 times of X5 if the multi-fin active region 200 includes two fins. In some instances, Y1 and Y2 are substantially the same. However, in instances where the isolation feature reduces loading effect in the area near S/D contact 1310, Y1 is about 1.1 times of Y2. That is, Y1 is 10% larger than Y2.

Figure 3:
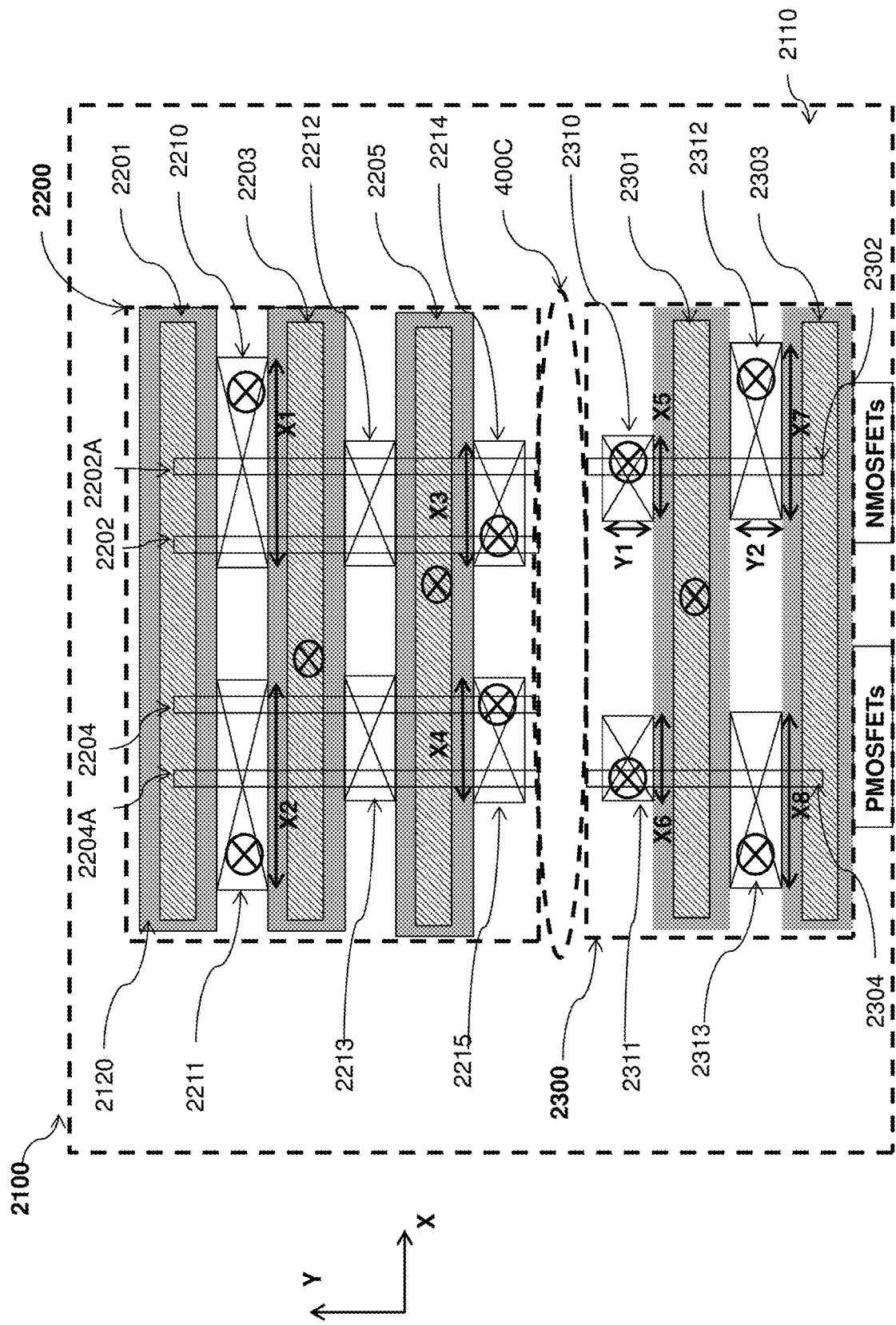
FIG. 3 is a diagrammatic top view of a semiconductor device, according to aspects of the present disclosure.

Referring now to FIG. 3, illustrated therein is a top view of semiconductor device 2100 according to aspects of the present disclosure. Semiconductor device 2100 includes fins 2202, 2202A, 2204, 2204A, 2302, and 2304. Fins 2202, 2202A, 2204, and 2204A are formed in a multi-fin active region 2200 while fins 2302 and 2304 are formed within a mono-fin active region 2300. In some instances, fins 2202 and 2202A are formed over a p-type well on semiconductor substrate 2110 and fins 2204 and 2204A are formed over an n-type well on semiconductor substrate 2110. In some embodiments, upon completion of the multi-fin active region 2200, fins 2202 and 2202A are part of at least one n-type FET (nFET) and fins 2204 and 2204A are part of at least one p-type FET (pFET). While FIG. 3 shows that each of the nFET and pFET in multi-fin active region 2200 includes two fins, implementation with more than two fins per FET can be appreciated by people skilled in the art upon examination of the present disclosure. In cases where each FETs of multi-fin active region 2200 include two fins, the multi-fin active region can be referred to as a double-fin active region. In some embodiments, each of multi-fin active region 2200 and mono-fin active region 2300 constitutes a standard cell. In that regard, multi-fin active region 2200 can be referred to as a multi-fin standard cell and mono-fin active region 2300 can be referred to as a mono-fin standard cell.

In some embodiments, fin 2302 is formed over the same p-type well where fins 2202 and 2202A are formed and fin 2304 is formed over the same n-type well where fins 2204 and 2204A are formed. Upon completion of the mono-fin active region 2300, fin 2302 is part of an nFET and fin 2304 is part of a pFET. As their names suggest, each the nFET and pFET in multi-fin active region 2200 includes more than one fin while each of the nFET and pFET in mono-fin active region 2300 includes a single fin. Semiconductor substrate 2110 and fins 2202A, 2202, 2204, 2204A, 2302 and 2304 contain materials and are formed in manners similar to those described above with respect to FIG. 1.

As shown in FIG. 3, in some embodiments, multi-fin active region 2200 includes gate structure 2201, 2203, and 2205 and mono-fin active region 2300 includes gate structures 2301 and 2303. Gate structures 2201, 2203, and 2205 are formed over and span across fins 2202A, 2202, 2204, and 2204A. Gate structures 2301 and 2303 are formed over and span across fins 2302 and 2304. In some embodiments, gate structures 2201, 2203, 2205, 2301, and 2303 contain materials and are formed in manners similar to those described above with respect to FIG. 1. Particularly, the formation of gate structures 2201, 2203, 2205, 2301, and 2303 include formation of dummy gates and replacement of those dummy gates with high-k metal gate stack.

Source/drain (S/D) features are formed over the fins on either side of a non-floating gate structure, such as gate structure 2203, 2205 and 2301. As shown in FIG. 3, for the nFET controlled by gate structure 2203 in multi-fin active region 2200, a S/D feature is formed below S/D contact 2210 and a S/D feature is formed below S/D contact 2212, with S/D contacts 2210 and 2212 on different sides of gate structure 2203. In some implementations, with respect to any FET in multi-fin active region 2200, a S/D feature and its corresponding S/D contact are formed across and span over all fins of that FET. For example, S/D contact 2210 and the S/D feature therebelow and S/D contact 2212 and the S/D feature therebelow are formed over and span across fins 2202 and 2202A. Similarly, for the nFET controlled by gate structure 2205 in multi-fin active region 2200, S/D contact 2212 and the S/D feature therebelow are on one side of gate structure 2205 while S/D contact 2214 and the S/D feature therebelow are on the other side of gate structure 2205. The same applies to the pFETs in multi-fin active region 2200 and the nFET and pFET in mono-fin active region 2300. For the pFET controlled by gate structure 2203, S/D contact 2211 and the S/D feature therebelow are on one side of gate structure 2203 while S/D contact 2213 and S/D feature therebelow are on the other side of gate structure 2203. For the pFET controlled by gate structure 2205, S/D contact 2213 and the S/D feature therebelow are on one side of gate structure 2205 while S/D contact 2215 and S/D feature therebelow are on the other side of gate structure 2205. For the nFET controlled by gate structure 2301, S/D contact 2310 and the S/D feature therebelow are on one side of gate structure 2301 while S/D contact 2312 and S/D feature therebelow are on the other side of gate structure 2301. Finally, for the pFET controlled by gate structure 2301, S/D contact 2311 and the S/D feature therebelow are on one side of gate structure 2301 while S/D contact 2313 and S/D feature therebelow are on the other side of gate structure 2301. S/D features and S/D contacts in FIG. 3 contain materials and are formed in manners similar to those described above with respect to FIG. 1.

At least for purpose of this disclosure, an FET that includes multiple fins is still considered one FET as long as its S/D features and gate structure are disposed over the same fins. For example, the device having gate structure 2203, S/D features below S/D contacts 2211 and 2213 is considered a single pFET even when the device spans across fin 2204 and fin 2204A. The same applies to FETs that have gate structures and S/D features spanning across more than two fins.

In some embodiments, multi-fin active region 2200 abuts mono-fin active region 2300 along the Y direction, or the direction of the fins 2202, 2202A, 2204, 2204A, 2302, and 2304, as shown in FIG. 3. In the implementations represented by FIG. 3, although multi-fin active region 2200 abuts mono-fin active region 2300, they are isolated by an isolation feature 400C. Particularly, no fin in multi-fin active region 2200 extends continuously into mono-fin active region 2300. Isolation feature 400C includes a gate-free region. That is, no gate structure, including any dummy gate, dummy dielectric gate, is formed in the area where isolation feature 400C is located. In these implementations, isolation feature includes an ILD layer. The ILD layer contains materials and is formed in manners similar to those described above with respective to FIG. 1. In the embodiments shown in FIG. 3, gate spacers 2120 are formed on the sidewalls of gate structures 2201, 2203, 2205, 2301 and 2303. Gate spacers 2120 contain materials and are formed in manners similar to those described above with respect to FIG. 1.

In some embodiments, each of the S/D contacts is substantially rectangular in shape. Along the X direction, S/D contacts 2210, 2211, 2212, 2213, 2214, 2215, 2310, 2311, 2312, and 2313 have lengths X1, X2, X3, X4, X5, X6, X7, and X8, respectively. In some embodiments, X1 is substantially equal to X2, X3 is substantially equal to X4, X5 is substantially equal to X6, and X7 is substantially equal to X8. In addition, along the Y direction, S/D contact 2310 has a width Y1 and S/D contact 2312 has a width Y2. In some implementations, S/D contacts 2210 and 2312 are electrically connected to a Vss line, also referred to as a source node. In those implementations, X1 is more than 1.5 times of X3. Similarly, X7 is more than 1.5 times of X3. In some other embodiments, to reduce contact capacitance between S/D contact 2214 and S/D contact 2310, S/D contact 2310 is intentionally shortened. In some implementations where the multi-fin active region 2200 includes more than two fins for both its nFET(s) and pFET(s), X3 is 1.1 to 3.0 times of X5. Put differently, in these implementations, the ratio of X3 over X5 ranges between 1.1 and 3.0. In some other implementations, X3 is 2 to 4 times of X5 if the multi-fin active region 200 includes more than two fins. In cases where multi-fin active region 2200 includes two fins for both its nFET(s) and pFET(s), X3 is about 1.1 to 2.0 times of X5. Put differently, the ratio of X3 over X5 in these cases ranges between 1.1 and 2.0. In some other implementations, X3 is 1.3 to 2.0 times of X5 if the multi-fin active region 200 includes two fins. In some instances, Y1 and Y2 are substantially the same. However, in instances where the isolation feature reduces loading effect in the area near S/D contact 2310, Y1 is about 1.1 times of Y2. That is, Y1 is 10% larger than Y2.

Figure 4:
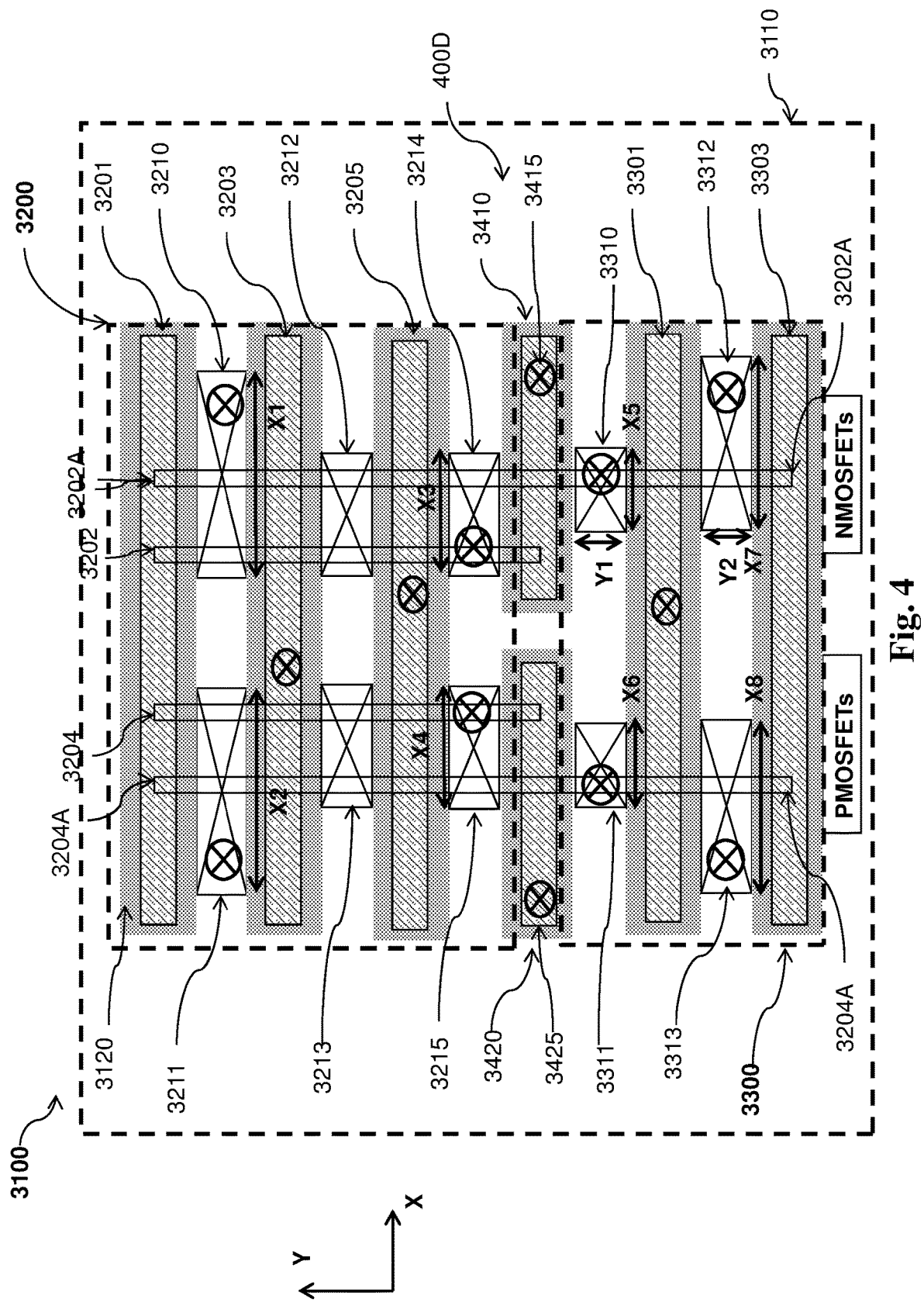
FIG. 4 is a diagrammatic top view of a semiconductor device, according to aspects of the present disclosure.

Referring now to FIG. 4, illustrated therein is a top view of semiconductor device 3100 according to aspects of the present disclosure. Semiconductor device 3100 includes fins 3202, 3202A, 3204, and 3204A. Fins 3202A and 3204A extend from multi-fin active region 3200 into mono-fin active region 3300 while fins 3202 and 3204 do not. In some instances, fins 3202 and 3202A are formed over a p-type well on semiconductor substrate 3110 and fins 3204 and 3204A are formed over an n-type well on semiconductor substrate 3110. In some embodiments, upon completion of the multi-fin active region 3200, fins 3202 and 3202A are part of at least one n-type FET (nFET) and fins 3204 and 3204A are part of at least one p-type FET (pFET) in multi-fin active region. While FIG. 4 shows that each of the nFET and pFET in multi-fin active region 3200 includes two fins, implementation with more than two fins per FET can be appreciated by people skilled in the art upon examination of the present disclosure. In cases where each FETs of multi-fin active region 3200 include two fins, the multi-fin active region can be referred to as a double-fin active region. In some embodiments, each of multi-fin active region 3200 and mono-fin active region 3300 constitutes a standard cell. In that regard, multi-fin active region 3200 can be referred to as a multi-fin standard cell and mono-fin active region 3300 can be referred to as a mono-fin standard cell.

In the embodiments represented by FIG. 4, the portion of fin 3202A in mono-fin active region 3300 is formed over the same p-type well where fins 3202 and 3202A are formed and the portion of the fin 3204A in mono-fin active region 3300 is formed over the same n-type well where fins 3204 and 3204A are formed. Upon completion of the mono-fin active region 3300, the portion of fin 3202A in mono-fin region 3300 is part of at least one nFET in mono-fin active region and the portion of fin 3204A in mono-fin region 3300 is part of at least one pFET in mono-fin active region. As their names suggest, each the nFET and pFET in multi-fin active region 3200 includes more than one fin while each of the nFET and pFET in mono-fin active region 3300 includes a single fin. Semiconductor substrate 3110 and fins 3202A, 3202, 3204, and 3204A contain materials and are formed in manners similar to those described above with respect to FIG. 1.

As shown in FIG. 4, in some embodiments, multi-fin active region 3200 includes gate structure 3201, 3203, and 3205 and mono-fin active region 3300 includes gate structures 3301 and 3303. Gate structures 3201, 3203, and 3205 are formed over and span across fins 3202A, 3202, 3204, and 3204A. Gate structures 3301 and 3303 are formed over and span across the portions of fins 3202A and 3204A in mono-fin active region 3300. In the embodiment shown in FIG. 4, semiconductor device 3100 also include a gate structure 3410 and a gate structure 3420, both of which are disposed parallel to gate structures 3201, 3203, 3205, 3301, and 3303 along the X direction. Gate structures 3410 and 3420 are positioned between multi-fin active region 3200 and mono-fin active region 3300 and serve as parts of an isolation feature 400D to isolate multi-fin active region 3200 from momo-fin active region 3300. In some implementations, gate structure 3410 is formed over fins 3202 and 3202A, with fin 3202 only extending about halfway thereunder. Gate structure 3420 is formed over fins 3204 and 3204A, with fin 3204 extending about halfway thereunder. In some embodiments, gate structures 3410 and 3420 are aligned in the X direction but are separate from one another. In some embodiments, gate structures 3201, 3203, 3205, 3301, 3303, 3410, and 3420 contain materials and are formed in manners similar to those described above with respect to FIG. 1. Particularly, the formation of gate structures 3201, 3203, 3205, 3301, 3303, 3410 and 3420 include formation of dummy gates and replacement of those dummy gates with high-k metal gate stack. Compared to gate structures 3201, 3203, 3205, 3301, and 3303, formation of gate structures 3410 and 3420 requires additional process steps. For example, to form gate structures 3410 and 3420, a continuous dummy gate is first formed over the location where gate structures 3410 and 3420 would be positioned. After the dummy gate is removed and before high-K metal gate stack is formed in place of the removed dummy gate, a dielectric feature is formed in the middle (where gate structures 3410 and 3420 are separated) as a separation. Thereafter the high-K metal gate stack is formed on either side of the dielectric feature, thus forming separate gate structures 3410 and 3420. Gate structures 3410 and 3420 may be formed by other processes. For instance, after the dummy gate is replaced with high-K metal gate stack, a middle portion of the high-K metal gate stack is removed by etching to separate gate structures 3410 and 3420. In the embodiments shown in FIG. 4, gate spacers 3120 are formed on the sidewalls of gate structures 3201, 3203, 3205, 3301, 3303, 3410, and 3420. Gate spacers 3120 contain materials and are formed in manners similar to those described above with respect to FIG. 1.

Source/drain (S/D) features are formed over the fins on either side of a non-floating gate structure, such as gate structure 3203, 3205 and 3301. As shown in FIG. 4, for the nFET controlled by gate structure 3203 in multi-fin active region 3200, a S/D feature is formed below S/D contact 3210 and a S/D feature is formed below S/D contact 3212, with S/D contacts 3210 and 3212 on different sides of gate structure 3203. In some implementations, with respect to any FET in multi-fin active region 3200, an S/D feature and its corresponding S/D contact are formed across and span over all fins of that FET. For example, S/D contact 3210 and the S/D feature therebelow and S/D contact 3212 and the S/D feature therebelow are formed over and span across fins 3202 and 3202A. Similarly, for the nFET controlled by gate structure 3205 in multi-fin active region 3200, S/D contact 3212 and the S/D feature therebelow are on one side of gate structure 3205 while S/D contact 3214 and the S/D feature therebelow are on the other side of gate structure 3205. The same applies to the pFETs in multi-fin active region 3200 and the nFET and pFET in mono-fin active region 3300. For the pFET controlled by gate structure 3203, S/D contact 3211 and the S/D feature therebelow are on one side of gate structure 3203 while S/D contact 3213 and S/D feature therebelow are on the other side of gate structure3 203. For the pFET controlled by gate structure 3205, S/D contact 3213 and the S/D feature therebelow are on one side of gate structure 3205 while S/D contact 215 and S/D feature therebelow are on the other side of gate structure 3205. For the nFET controlled by gate structure 3301, S/D contact 3310 and the S/D feature therebelow are on one side of gate structure 3301 while S/D contact 3312 and S/D feature therebelow are on the other side of gate structure 3301. Finally, for the pFET controlled by gate structure 3301, S/D contact 3311 and the S/D feature therebelow are on one side of gate structure 3301 while S/D contact 3313 and S/D feature therebelow are on the other side of gate structure 3301. S/D features and S/D contacts in FIG. 4 contain materials and are formed in manners similar to those described above with respect to FIG. 1.

At least for purpose of this disclosure, an FET that includes multiple fins is still considered one FET as long as its S/D features and gate structure are disposed over the same fins. For example, the device having gate structure 3203, S/D features below S/D contacts 3211 and 3213 is considered a single pFET even when the device spans across fin 3204 and fin 3204A. The same applies to FETs that have gate structures and S/D features spanning across more than two fins.

In some embodiments, multi-fin active region 3200 abuts mono-fin active region 3300 along the Y direction, or the direction of the fins 3202, 3202A, 3204, and 3204A, as shown in FIG. 4. In the implementations represented by FIG. 4, although multi-fin active region 3200 abuts mono-fin active region 3200, they are isolated by isolation feature 400D. In some embodiments, isolation feature 400D includes an isolation nFET and an isolation pFET. The isolation nFET includes fin 3202A formed over a p-type well on semiconductor substrate 3110, gate structure 3410, S/D contact 3214 and the S/D feature therebelow, and S/D contact 3310 and S/D feature therebelow. By way of an interconnect via 3415, gate structure 3410 is electrically connected to a Vss line, which is usually referred to as a low voltage line or a source node, and the isolation nFET formed over gate structure 3410 is constantly turned off, shutting down the channels in fin 3202A across gate structure 3410. The isolation pFET includes fin 3204A formed over an n-type well on semiconductor substrate 3110, gate structure 3420, S/D contact 3215 and the S/D feature therebelow, and S/D contact 3311 and S/D feature therebelow. By way of an interconnect via 3425, gate structure 3420 is electrically connected to a Vdd line, which is usually the high voltage line, and the isolation pFET formed over gate structure 3420 is constantly turned off, shutting down the channels in fin 3204A across gate structure 3420. As both isolation nFET and pFET are turned off, multi-fin active region 3200 is effectively isolated from mono-fin active region 3300 by isolation feature 400D.

In some embodiments, each of the S/D contacts is substantially rectangular in shape. Along the X direction, S/D contacts 3210, 3211, 3212, 3213, 3214, 3215, 3310, 3311, 3312, and 3313 have lengths X1, X2, X3, X4, X5, X6, X7, and X8, respectively. In some embodiments, X1 is substantially equal to X2, X3 is substantially equal to X4, X5 is substantially equal to X6, and X7 is substantially equal to X8. In addition, along the Y direction, S/D contact 3310 has a width Y1 and S/D contact 3312 has a width Y2. In some implementations, S/D contacts 3210 and 3312 are electrically connected to a Vss line, also referred to as a source node. In those implementations, X1 is more than 1.5 times of X3. Similarly, X7 is more than 1.5 times of X3. In some other embodiments, to reduce contact capacitance between S/D contact 3214 and S/D contact 3310, S/D contact 3310 is intentionally shortened. In some implementations where the multi-fin active region 3200 includes more than two fins for both its nFET(s) and pFET(s), X3 is 1.1 to 3.0 times of X5. Put differently, in these implementations, the ratio of X3 over X5 ranges between 1.1 and 3.0. In some other implementations, X3 is 2 to 4 times of X5 if the multi-fin active region 200 includes more than two fins. In cases where multi-fin active region 3200 includes two fins for both its nFET(s) and pFET(s), X3 is about 1.1 to 2.0 times of X5. Put differently, the ratio of X3 over X5 in these cases ranges between 1.1 and 2.0. In some other implementations, X3 is 1.3 to 2.0 times of X5 if the multi-fin active region 200 includes two fins. In some instances, Y1 and Y2 are substantially the same. However, in instances where the isolation feature reduces loading effect in the area near S/D contact 3310, Y1 is about 1.1 times of Y2. That is, Y1 is 10% larger than Y2.

Figure 5:
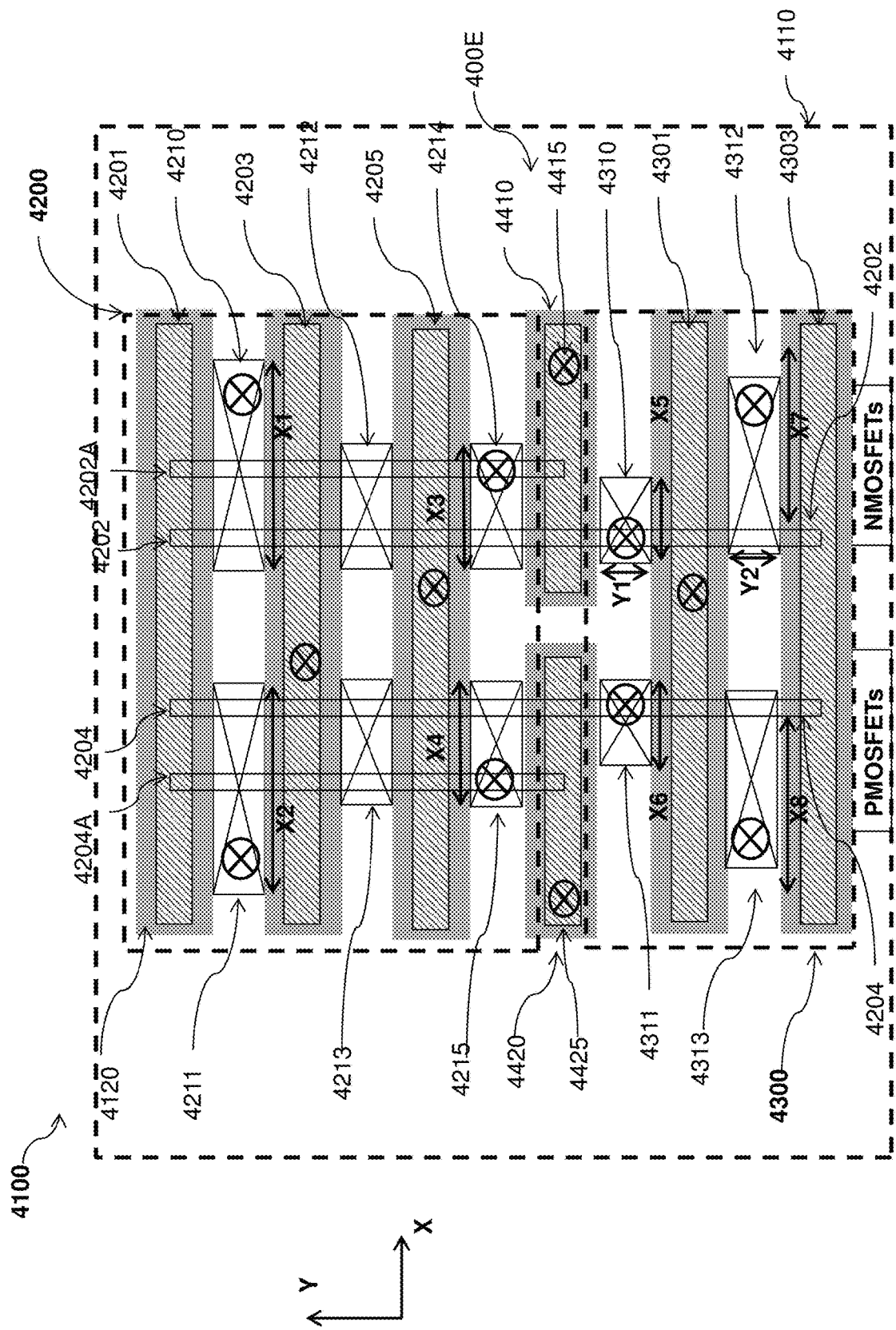
FIG. 5 is a diagrammatic top view of a semiconductor device, according to aspects of the present disclosure.

Referring now to FIG. 5, illustrated therein is a top view of semiconductor device 4100 according to aspects of the present disclosure. Semiconductor device 4100 includes fins 4202, 4202A, 4204, and 4204A. Different from the embodiment shown in FIG. 4, fins 4202 and 4204, not fins 4202A and 4204A, extend from multi-fin active region 4200 into mono-fin active region 4300 while fins 4202A and 4204A do not. In some instances, fins 4202 and 4202A are formed over a p-type well on semiconductor substrate 4110 and fins 4204 and 4204A are formed over an n-type well on semiconductor substrate 4110. In some embodiments, upon completion of the multi-fin active region 4200, fins 4202 and 4202A are part of at least one n-type FET (nFET) and fins 4204 and 4204A are part of at least one p-type FET (pFET) in multi-fin active region. While FIG. 5 shows that each of the nFET and pFET in multi-fin active region 4200 includes two fins, implementation with more than two fins per FET can be appreciated by people skilled in the art upon examination of the present disclosure. In cases where each FETs of multi-fin active region 4200 include two fins, the multi-fin active region can be referred to as a double-fin active region. In some embodiments, each of multi-fin active region 4200 and mono-fin active region 4300 constitutes a standard cell. In that regard, multi-fin active region 4200 can be referred to as a multi-fin standard cell and mono-fin active region 4300 can be referred to as a mono-fin standard cell.

In the embodiments represented by FIG. 5, the portion of fin 4202 in mono-fin active region 4300 is formed over the same p-type well where fins 4202 and 4202A are formed and the portion of the fin 4204 in mono-fin active region 4300 is formed over the same n-type well where fins 4204 and 4204A are formed. Upon completion of the mono-fin active region 4300, the portion of fin 4202 in mono-fin region 4300 is part of at least one nFET in mono-fin active region and the portion of fin 4204 in mono-fin region 4300 is part of at least one pFET in mono-fin active region. As their names suggest, each the nFET and pFET in multi-fin active region 4200 includes more than one fin while each of the nFET and pFET in mono-fin active region 4300 includes a single fin. Semiconductor substrate 4110 and fins 4202A, 4202, 4204, and 4204A contain materials and are formed in manners similar to those described above with respect to FIG. 1.

As shown in FIG. 5, in some embodiments, multi-fin active region 4200 includes gate structure 4201, 4203, and 4205 and mono-fin active region 4300 includes gate structures 4301 and 4303. Gate structures 4201, 4203, and 4205 are formed over and span across fins 4202A, 4202, 4204, and 4204A. Gate structures 4301 and 4303 are formed over and span across the portions of fins 4202 and 4204 in mono-fin active region 4300. In the embodiment shown in FIG. 5, semiconductor device 4100 also include a gate structure 4410 and a gate structure 4420, both of which are disposed parallel to gate structures 4201, 4203, 4205, 4301, and 4303 along the X direction. Gate structures 4410 and 4420 are positioned between multi-fin active region 4200 and mono-fin active region 4300 and serve as parts of an isolation feature 400E to isolate multi-fin active region 4200 from multi-fin active region. In some implementations, gate structure 4410 is formed over fins 4202 and 4202A, with fin 4202A only extending about halfway thereunder. Gate structure 4420 is formed over fins 4204 and 4204A, with fin 4204A extending about halfway thereunder. In some embodiments, gate structures 4410 and 4420 are aligned in the X direction but are separate from one another. In some embodiments, gate structures 4201, 4203, 4205, 4301, 4303, 4410, and 4420 contain materials and are formed in manners similar to those described above with respect to FIG. 1. Particularly, the formation of gate structures 4201, 4203, 4205, 4301, 4303, 4410 and 4420 include formation of dummy gates and replacement of those dummy gates with high-k metal gate stack. Compared to gate structures 4201, 4203, 4205, 4301, and 4303, formation of gate structures 4410 and 4420 requires additional process steps. For example, to form gate structures 4410 and 4420, a continuous dummy gate is first formed over the location where gate structures 4410 and 4420 would be positioned. After the dummy gate is removed and before high-K metal gate stack is formed in place of the removed dummy gate, a dielectric feature is formed in the middle (where gate structures 4410 and 4420 would be separated) as a separation. Thereafter the high-K metal gate stack is formed on either side of the dielectric feature, thus forming separate gate structures 4410 and 4420. Gate structures 4410 and 4420 may be formed by other processes. For instance, after the dummy gate is replaced with high-K metal gate stack, a middle portion of the high-K metal gate stack is removed by etching to separate gate structures 4410 and 4420. In the embodiments shown in FIG. 5, gate spacers 4120 are formed on the sidewalls of gate structures 4201, 4203, 4205, 4301, 4303, 4410, and 4420. Gate spacers 4120 contain materials and are formed in manners similar to those described above with respect to FIG. 1.

Source/drain (S/D) features are formed over the fins on either side of a non-floating gate structure, such as gate structure 4203, 4205 and 4301. As shown in FIG. 5, for the nFET controlled by gate structure 4203 in multi-fin active region 4200, an S/D feature is formed below S/D contact 4210 and a S/D feature is formed below S/D contact 4212, with S/D contacts 4210 and 4212 on different sides of gate structure 4203. In some implementations, with respect to any FET in multi-fin active region 4200, an S/D feature and its corresponding S/D contact are formed across and span over all fins of that FET. For example, S/D contact 4210 and the S/D feature therebelow and S/D contact 4212 and the S/D feature therebelow are formed over and span across fins 4202 and 4202A. Similarly, for the nFET controlled by gate structure 4205 in multi-fin active region 4200, S/D contact 4212 and the S/D feature therebelow are on one side of gate structure 4205 while S/D contact 4214 and the S/D feature therebelow are on the other side of gate structure 4205. The same applies to the pFETs in multi-fin active region 4200 and the nFET and pFET in mono-fin active region 4300. For the pFET controlled by gate structure 4203, S/D contact 4211 and the S/D feature therebelow are on one side of gate structure 4203 while S/D contact 4213 and S/D feature therebelow are on the other side of gate structure 4203. For the pFET controlled by gate structure 4205, S/D contact 4213 and the S/D feature therebelow are on one side of gate structure 4205 while S/D contact 4215 and S/D feature therebelow are on the other side of gate structure 4205. For the nFET controlled by gate structure 4301, S/D contact 4310 and the S/D feature therebelow are on one side of gate structure 4301 while S/D contact 4312 and S/D feature therebelow are on the other side of gate structure 4301. Finally, for the pFET controlled by gate structure 4301, S/D contact 4311 and the S/D feature therebelow are on one side of gate structure 4301 while S/D contact 4313 and S/D feature therebelow are on the other side of gate structure 4301. S/D features and S/D contacts in FIG. 5 contain materials and are formed in manners similar to those described above with respect to FIG. 1.

At least for purpose of this disclosure, an FET that includes multiple fins is still considered one FET as long as its S/D features and gate structure are disposed over the same fins. For example, the device having gate structure 4203, S/D features below S/D contacts 4211 and 4213 is considered a single pFET even when the device spans across fin 4204 and fin 4204A. The same applies to FETs that have gate structures and S/D features spanning across more than two fins.

In some embodiments, multi-fin active region 4200 abuts mono-fin active region 4300 along the Y direction, or the direction of the fins 4202, 4202A, 4204, and 4204A, as shown in FIG. 5. In the implementations represented by FIG. 5, although multi-fin active region 4200 abuts mono-fin active region 4300, they are isolated by isolation feature 400E. In some embodiments, isolation feature 400E includes an isolation nFET and an isolation pFET. The isolation nFET includes fin 4202 formed over a p-type well on semiconductor substrate 4110, gate structure 4410, S/D contact 4214 and the S/D feature therebelow, and S/D contact 4310 and S/D feature therebelow. By way of an interconnect via 4415, gate structure 4410 is electrically connected to a Vss line, which is usually referred to as a low voltage line or a source node, and the isolation nFET formed over gate structure 4410 is constantly turned off, shutting down the channels in fin 4202 across gate structure 4410. The isolation pFET includes fin 4204 formed over an n-type well on semiconductor substrate 4110, gate structure 4420, S/D contact 4215 and the S/D feature therebelow, and S/D contact 4311 and S/D feature therebelow. By way of an interconnect via 4425, gate structure 4420 is electrically connected to a Vdd line, which is usually the high voltage line, and the isolation pFET formed over gate structure 4420 is constantly turned off, shutting down the channels in fin 4204 across gate structure 4420. As both isolation nFET and pFET are turned off, multi-fin active region 4200 is effectively isolated from mono-fin active region 4300 by isolation feature 400E.

In some embodiments, each of the S/D contacts is substantially rectangular in shape. Along the X direction, S/D contacts 4210, 4211, 4212, 4213, 4214, 4215, 4310, 4311, 4312, and 4313 have lengths X1, X2, X3, X4, X5, X6, X7, and X8, respectively. In some embodiments, X1 is substantially equal to X2, X3 is substantially equal to X4, X5 is substantially equal to X6, and X7 is substantially equal to X8. In addition, along the Y direction, S/D contact 4310 has a width Y1 and S/D contact 4312 has a width Y2. In some implementations, S/D contacts 4210 and 4312 are electrically connected to a Vss line, also referred to as a source node. In those implementations, X1 is more than 1.5 times of X3. Similarly, X7 is more than 1.5 times of X3. In some other embodiments, to reduce contact capacitance between S/D contact 4214 and S/D contact 4310, S/D contact 4310 is intentionally shortened. In some implementations where the multi-fin active region 4200 includes more than two fins for both its nFET(s) and pFET(s), X3 is 1.1 to 3.0 times of X5. Put differently, in these implementations, the ratio of X3 over X5 ranges between 1.1 and 3.0. In some other implementations, X3 is 2 to 4 times of X5 if the multi-fin active region 200 includes more than two fins. In cases where multi-fin active region 4200 includes two fins for both its nFET(s) and pFET(s), X3 is about 1.1 to 2.0 times of X5. Put differently, the ratio of X3 over X5 in these cases ranges between 1.1 and 2.0. In some other implementations, X3 is 1.3 to 2.0 times of X5 if the multi-fin active region 4200 includes two fins. In some instances, Y1 and Y2 are substantially the same. However, in instances where the isolation feature reduces loading effect in the area near S/D contact 4310, Y1 is about 1.1 times of Y2. That is, Y1 is 10% larger than Y2.

Each of multi-fin active regions 200, 1200, 2200, 3200, 4200 and mono-fin active regions 300, 1300, 2300, 3300, 4300 can be viewed as a standard cell. That is, semiconductor device 100 (or 1100, 2100, 3100, 4100) is considered a column (along the X-direction) of two standard cells. Persons skilled in the art, upon examination of the present disclosure, would appreciate that the present disclosure contemplates not only a column of few standard cells but an array of a large number of standard cells. For illustration purposes, FIGS. 1-5 show two standard cells to demonstrate advantages of the semiconductor device 100 (or 1100, 2100, 3100, 4100) according to aspects of the present disclosure.

Figure 6:
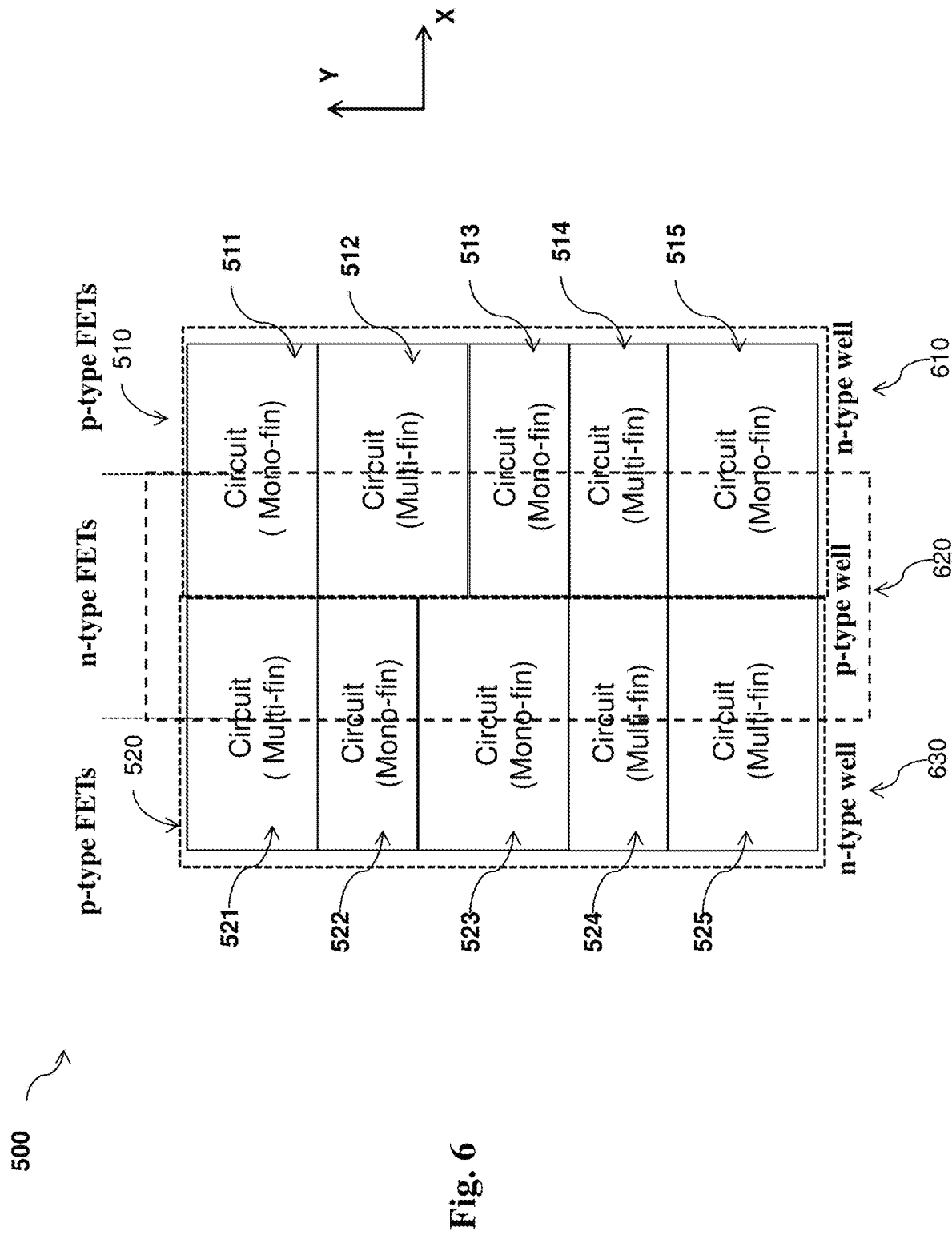
FIG. 6 is a diagrammatic top view of a semiconductor cell array, according to aspects of the present disclosure.

Referring now to FIG. 6, shown therein is diagrammatic top view of two columns of standard cells 510 and 520 in a semiconductor cell array 500, according to aspects of the present disclosure. For illustration purposes, FIG. 6 shows that the first column of standard cells 510 (hereinafter referred to as "first column") includes standard cells 511, 512, 513, 514, and 515 and second column of standard cells ("second column") includes standard cells 521, 522, 523, 524, and 525. The standard cells 511-515 span across an n-type well 610 and a p-type well 620 and the standard cells 521-525 span across the p-type well 620 and another n-type well 630. Arranged in this manner, standard cells 511-515 of the first column 510 share the same p-type well 620 with standard cells 521-525 of the second column 520. Furthermore, in these implementations, the nFETs of standard cells 511-515 are adjacent to nFETs of standard cells 521-525. The semiconductor cell array 500 can also be rearranged so that the first column 510 and the second column 520 share the same n-type well. For example, the first column 510 can have its pFETs on the left-hand side and its nFET on the right-hand side while the second column 520 can have its pFET on the right-hand side and its nFET on the left-hand side. That way, the pFETs of the first column 510 can share the same n-type well with the pFETs of the second column 520. In some instances, the semiconductor cell array 500 is scalable by having more rows of standard cells abutting the first column 510 or the second column 520 or by adding more standard cells to first column 510 and second column 520. In those instances, a column of standard cells adjacent to the first column 510 can have pFETs that share the same n-type well 610 with standard cells 511-515 in first column 510. Similarly, a column of standard cells adjacent to the second column 520 can have pFETs that share the same n-type well 630 with standard cells 521-525 in second column 520.

Each of the standard cells 511-15 and 521-525 can consist of a multi-fin active region to function as a multi-fin device or of a mono-fin active region to function as a mono-fin device. Sometimes a standard cell comprised of a multi-fin active region can be referred to a multi-fin standard cell. Similarly, a standard cell comprised of a mono-fin active region can be referred to a mono-fin standard cell. For example, with respect to first column 510, as illustrated in FIG. 6, standard cells 512 and 514 are multi-fin devices and standard cells 511, 513 and 515 are mono-fin devices. With respect to the second column 520, standard cells 521, 524 and 525 are multi-fin devices while standard cell 522 and 523 are mono-fin devices. In terms of circuit design, standard cells 512, 514, 521, 524, and 525 are multi-fin standard cells and standard cells 511, 513, 515, 522, and 523 are mono-fin standard cells. In some implementations, the first column 510 and the second column 520 span along the same length along the length-wise direction of the fins that are disposed over the first column 510 and the second column 520. In those implementations, the first column 510 and the second column 520 are substantially rectangular in shape and have the same length along the length-wise direction of the fins. In some instances, the length of the first and second rows 510 and 520 along the Y direction are proportional to the number of gate structure (including dielectric dummy gates). That is to say, when the length of the first column 510 is substantially equal to the length of the second column 520, the number of gate electrodes in the first column 510 and the second column 520 are substantially similar.

Depending on the design of the semiconductor device 100 or semiconductor cell array 500, mono-fin active region 300 (or a mono-fin standard cell) and multi-fin active region 200 (or a multi-fin standard cell) can include a variety of devices. In circuit design, while fast switching speed and low leakage current are almost always preferred, sometimes they cannot be achieved at the same time and tradeoffs have to be made. In those situations, if speed is more important than leakage in certain node or application, a multi-fin standard cell is preferred over a mono-fin standard cell. However, if leakage is more important than speed in another node or application, then a mono-fin standard cell may be more preferable than a multi-fin standard cell. Conventionally, if a circuit demands both mono-fin devices and multi-fin devices, they are fabricated in different colonies on a substrate and are connected via interconnect structures. The embodiments in the present disclosure allow multi-fin standard cells and mono-fin standard cells to be placed next to one another to meet the design requirements in speed and leakages, thus eliminating the need for complex interconnect structures.

Thus, the present disclosure provides examples of a semiconductor device and a semiconductor cell array. In some embodiments, a semiconductor device includes a multi-fin active region, a mono-fin active region, and an isolation feature between the multi-fin active region and the mono-fin active region. The multi-fin active region includes a first plurality of fins, a second plurality of fins parallel to the first plurality of fins, a first n-type field effect transistor (FET), a first p-type FET. The first n-type FET includes a first gate structure disposed over the first plurality of fins and first source/drain (S/D) contacts on either side of the first gate structure. Each of the S/D contacts is disposed over the first plurality of fins. The first p-type FET includes the first gate structure disposed over the second plurality of fins and second S/D contacts on either side of the first gate structure. Each of the S/D contacts is disposed over the second plurality of fins. The mono-fin active region abuts the multi-fin active region. The mono-fin active region includes a first fin, a second fin different from the first fin, a second n-type FET, and a second p-type FET. The second n-type FET includes a second gate structure disposed over the first fin and third S/D contacts on either side of the second gate structure. Each of the third S/D contacts is disposed over the first fin. The second p-type FET includes the second gate structure disposed over the second fin and fourth S/D contacts on either side of the second gate structure. Each of the fourth S/D contacts is disposed over the second fin. The isolation feature is parallel to the first and second gate structures.

In some such embodiments, the first fin of the semiconductor device is aligned with one of the first plurality of fins and the second fin is aligned with one of the second plurality of fins. In some implementations, the isolation feature of the semiconductor device includes a dummy dielectric gate. In some other implementations, the isolation feature of the semiconductor device includes a fin cutout region. In still some other implementations, the isolation feature of the semiconductor device includes an isolation p-type FET and an isolation n-type FET. The isolation p-Type FET includes a gate electrically connected to a Vdd line and the isolation n-type FET includes a gate electrically connected to a Vss line. In some embodiments, the first and second S/D contacts of the semiconductor device includes a first group of S/D contacts away from the mono-fin active region and a second group of S/D contacts adjacent to the mono-fin active region. Each of the first group of S/D contacts has a first length parallel to the first gate structure and each of the second group of S/D contacts has a second length parallel to the first gate structure. The first length is greater than the second length. In some such embodiments, the third and fourth S/D contacts of the semiconductor device include a third group of S/D contacts adjacent to the multi-fin active region and a fourth group of S/D contacts away from the multi-fin active region. Each of the third group of S/D contacts has a third length parallel to the second gate structure and each of the fourth group of S/D contacts has a fourth length parallel to the second gate structure. The third length is smaller than the second length. In some such embodiments, the first length is at least 1.5 times of the second length, the first plurality of fins comprises more than two fins, the second plurality of fins comprises more than two fins, and a ratio of the second length over the third length ranges between 2 and 4. In some such embodiments, each of the third group of S/D contacts has a first width parallel to the first fin and each of the fourth group of S/D contacts has a second width parallel to the first fin. The first width is larger than the second width.

In further embodiments, a semiconductor cell array includes a first column of standard cells and a second column of standard cells. Each of the first column of standard cells includes a p-type field effect transistor (FET) and an n-type FET. Each of the second column of standard cells includes a p-type FET and an n-type FET. The n-type FETs in the first column of standard cells share a same p-type well with the n-type FETs in the second column of standard cells. The first column of standard cells includes a multi-fin standard cell and a mono-fin standard cell. The multi-fin standard cell is adjacent to the mono-fin standard cell. The multi-fin standard cell is isolated from the mono-fin standard cell by an isolation feature. In some such embodiments, the multi-fin standard cell includes a first gate structure and first source/drain (S/D) contacts adjacent to mono-fin standard cell. The first gate structure and the first S/D contacts are disposed over a plurality of fins. The mono-fin standard cell includes a second gate structure parallel to the first gate structure and second source/drain (S/D) contacts adjacent to the multi-fin standard cell. The second gate structure and the second S/D contacts are disposed over a fin. In some instances, each of the first S/D contacts includes a first length parallel to the first gate structure and each of the second S/D contacts includes a second length parallel to the second gate structure. In some other instances, a ratio of the first length over the second length ranges between 1.1 and 3.0. In some other embodiments, the multi-fin standard cell abuts the mono-fin standard cells such that the fin is aligned with one of the plurality of fins. In some instances, each of the first column of standard cells and the second column of standard cells is rectangular in shape and a total number of gate structures in the first column of standard cells is identical to a total number of gate structures in the second column of standard cells.

In yet further embodiments, a semiconductor device includes a double-fin active region, a mono-fin active region abutting the double-fin active region, and an isolation feature between the double-fin active region and the mono-fin active region. The double-fin active region includes a first pair of fins, a second pair of fins parallel to the first pair of fins, a first n-type field effect transistor (FET) including a first gate structure disposed over the first pair of fins and first source/drain (S/D) contacts on either side of the first gate structure, each of the first S/D contacts being disposed over the first pair of fins, a first p-type FET, including the first gate structure disposed over the second pair of fins and second source/drain (S/D) contacts on either side of the first gate structure, each of the second S/D contacts being disposed over the second pair of fins. The mono-fin active region includes a first fin, a second fin different from the first fin, a second n-type FET including a second gate structure disposed over the first fin and third S/D contacts on either side of the second gate structure, each of the third S/D contacts being disposed over the first fin, a second p-type FET including the second gate structure disposed over the second fin and fourth S/D contacts on either side of the second gate structure, each of the fourth S/D contacts being disposed over the second fin; and an isolation feature between the double-fin active region and the mono-fin active region, the isolation feature being parallel to the first and second gate structures. In some such embodiments, the first fin is aligned with one of the first pair of fins and the second fin is aligned with one of the second pair of fins. In some implementations, the isolation feature comprises a dummy dielectric gate. In some other embodiments, the isolation feature includes a fin cutout region. In some instances, the isolation feature includes an isolation p-type FET and an isolation n-type FET. In those instances, the isolation p-Type FET includes a gate electrically connected to a Vdd line and the isolation n-type FET includes a gate electrically connected to a Vss line.

In some embodiments, the first and second S/D contacts of the semiconductor device includes a first group of S/D contacts away from the mono-fin active region and a second group of S/D contacts adjacent to the mono-fin active region. Each of the first group of S/D contacts has a first length parallel to the first gate structure. Each of the second group of S/D contacts has a second length parallel to the first gate structure. The first length is greater than the second length. The third and fourth S/D contacts include a third group of S/D contacts adjacent to the double-fin active region and a fourth group of S/D contacts away from the double-fin active region. Each of the third group of S/D contacts has a third length parallel to the second gate structure and each of the fourth group of S/D contacts has a fourth length parallel to the second gate structure. The second length is greater than the third length. In some implementations, a ratio of the second length over the third length ranges between 1.3 and 2.0. In some implementations, the first n-type FET and the second n-type FET share a p-type well, and the first p-type FET and the second p-type FET share an n-type well.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first plurality of fins;
   a second plurality of fins;
   a first gate structure disposed over the first plurality of fins and the second plurality of fins;
   a first fin lengthwise aligned with one of the first plurality of fins;
   a second fin lengthwise aligned with one of the second plurality of fins;
   a second gate structure disposed over the first fin and the second fin; and
   an isolation feature between the first plurality of fins and the first fin as well as between the second plurality of fins and the second fin,
   wherein the isolation feature is parallel to the first gate structure and the second gate structure.

2. The semiconductor structure of claim 1,
   wherein the first plurality of fins and the first fin are disposed over an n-type well,
   wherein the second plurality of fins and the second fin are disposed over a p-type well.

3. The semiconductor structure of claim 1, further comprising:
   a first source/drain contact disposed over the first plurality of fins;
   a second source/drain contact disposed over the second plurality of fins;
   a third source/drain contact disposed over the first fin; and
   a fourth source/drain contact disposed over the second fin.

4. The semiconductor structure of claim 3,
   wherein the first gate structure and the second gate structure extend along a direction,
   wherein a first length of the first source/drain contact along the direction is greater than a second length of the third source/drain contact along the direction.

5. The semiconductor structure of claim 1,
   wherein the first plurality of fins comprises two fins, and wherein the second plurality of fins comprises two fins.

6. The semiconductor structure of claim 1, wherein the isolation feature comprises a dummy dielectric gate.

7. The semiconductor structure of claim 1, wherein the isolation feature comprises a fin cutout region.

8. The semiconductor structure of claim 1,
   wherein the isolation feature comprises an isolation p-type FET and an isolation n-type FET,
   wherein the isolation p-Type FET includes a third gate structure electrically connected to a Vdd line, and
   wherein the isolation n-type FET includes a fourth gate structure electrically connected to a Vss line.

9. The semiconductor structure of claim 8, wherein the third gate structure is aligned with the fourth gate structure.

10. A semiconductor structure, comprising:
    a double-fin transistor comprising:
      a first fin and a second fin,
      a first gate structure disposed over the first fin and the second fin, and
      a first source/drain contact adjacent the first gate structure and disposed over the first fin and the second fin;
    a mono-fin transistor comprising
      a third fin,
      a second gate structure disposed over the third fin, and
      a second source/drain contact adjacent the second gate structure and disposed over the third fin; and
    an isolation feature between the double-fin transistor and the mono-fin transistor, wherein the isolation feature is parallel to the first gate structure and the second gate structure.

11. The semiconductor structure of claim 10, wherein the isolation feature comprises a dummy dielectric gate.

12. The semiconductor structure of claim 11, wherein the dummy dielectric gate comprises silicon oxide ($SiO_2$), silicon nitride (SiN), silicon carbide (SiC), silicon oxynitride (SiON), or a combination thereof.

13. The semiconductor structure of claim 10, wherein the isolation feature comprises a fin cutout region.

14. The semiconductor structure of claim 10,
    wherein the double-fin transistor and the mono-fin transistor are n-type,
    wherein the isolation feature comprises an isolation n-type FET,
    wherein the isolation n-type FET includes a third gate structure electrically coupled to a Vss line.

15. The semiconductor structure of claim 10, wherein the first fin is continuous with the third fin.

16. The semiconductor structure of claim 10,
    wherein the double-fin transistor and the mono-fin transistor are p-type,
    wherein the isolation feature comprises an isolation p-type FET, wherein the isolation p-type FET includes a fourth gate structure electrically coupled to a Vdd line.

17. A semiconductor device comprising:
a first double-fin transistor comprising:
   a first fin and a second fin,
   a first gate structure disposed over the first fin and the second fin, and
   a first source/drain contact adjacent the first gate structure and disposed over the first fin and the second fin;
a second double-fin transistor comprising:
   a third fin and a fourth fin, the fourth fin being farther away from the second fin and the third fin,
   a second gate structure disposed over the third fin and the fourth fin, and
   a second source/drain contact adjacent the second gate structure and disposed over the third fin and the fourth fin;
a first mono-fin transistor comprising
   a fifth fin,
   a third gate structure disposed over the fifth fin, and
   a third source/drain contact adjacent the third gate structure and disposed over the fifth fin;
a second mono-fin transistor comprising
   a sixth fin,
   a fourth gate structure disposed over the sixth fin, and
   a fourth source/drain contact adjacent the fourth gate structure and disposed over the sixth fin; and
an isolation feature between the first double-fin transistor and the first mono-fin transistor as well as between the second double-fin transistor and the second mono-fin transistor, wherein the isolation feature is parallel to the first gate structure and the second gate structure.

18. The semiconductor device of claim 17, wherein the first fin is aligned with the fifth fin and the fourth fin is aligned with the sixth fin.

19. The semiconductor device of claim 17, wherein the second fin is aligned with the fifth fin and the third fin is aligned with the sixth fin.

20. The semiconductor device of claim 17, wherein the isolation feature comprises an N-type FET and a P-type FET.

* * * * *